United States Patent
Yamada

(10) Patent No.: US 9,571,040 B2
(45) Date of Patent: Feb. 14, 2017

(54) AUDIO AMPLIFIER AND POWER SUPPLY VOLTAGE SWITCHING METHOD

(71) Applicant: Yamaha Corporation, Hamamatsu-shi, Shizuoka (JP)

(72) Inventor: Morito Yamada, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 119 days.

(21) Appl. No.: 14/380,492

(22) PCT Filed: Feb. 6, 2013

(86) PCT No.: PCT/JP2013/052727
§ 371 (c)(1),
(2) Date: Aug. 22, 2014

(87) PCT Pub. No.: WO2013/125348
PCT Pub. Date: Aug. 29, 2013

(65) Prior Publication Data
US 2015/0030184 A1  Jan. 29, 2015

(30) Foreign Application Priority Data
Feb. 23, 2012  (JP) .................................. 2012-037732

(51) Int. Cl.
*H03F 21/00* (2006.01)
*H03F 1/02* (2006.01)
(Continued)

(52) U.S. Cl.
CPC ............ *H03F 1/0222* (2013.01); *H03F 1/025* (2013.01); *H03F 1/0244* (2013.01); *H03F 1/305* (2013.01);
(Continued)

(58) Field of Classification Search
CPC ......... H04R 17/00; H04R 1/2857; H04R 1/30; H04R 2205/021; H04R 5/02; H04B 2203/5445; H04B 3/542; G10L 17/06; G10L 21/0208; G10L 25/78
(Continued)

(56) References Cited

U.S. PATENT DOCUMENTS 4,873,493 A * 10/1989 Fujiwara ............... H03F 1/0244
                                                          330/134
7,130,415 B2 * 10/2006 Melsa .................. H04M 19/001
                                                          330/127
(Continued)

FOREIGN PATENT DOCUMENTS

EP    0 279 694 B1    4/1992
EP    2 346 164 A2    7/2011
(Continued)

OTHER PUBLICATIONS

International Search Report dated Apr. 23, 2013 with English translation (five (5) pages).
(Continued)

*Primary Examiner* — Lun-See Lao
(74) *Attorney, Agent, or Firm* — Crowell & Moring LLP

(57) ABSTRACT

An audio amplifier is provided with: an amplifier circuit; a power supply circuit that generates a plurality of power supply voltages; a power supply relay that selects one of the power supply voltages as the power supply voltage supplied to the amplifier circuit; a switching condition determiner that determines whether the switching condition of the power supply relay is satisfied; a silent section detector that detects a silent section of the audio signal which is equal to or greater than the operation time of the power supply relay; and a switching instruction unit for providing the power supply relay with an instruction for switching the power
(Continued)

supply voltage during the silent section when the switching condition is satisfied and the silent section is detected.

9 Claims, 5 Drawing Sheets

(51) Int. Cl.
 *H03F 1/30* (2006.01)
 *H03F 3/183* (2006.01)
 *H03F 3/21* (2006.01)
 *H03G 7/00* (2006.01)

(52) U.S. Cl.
 CPC ............... *H03F 3/183* (2013.01); *H03F 3/21* (2013.01); *H03G 7/002* (2013.01); *H03G 7/007* (2013.01); *H03F 2200/03* (2013.01); *H03F 2200/504* (2013.01); *H03F 2200/507* (2013.01); *H03F 2200/511* (2013.01)

(58) Field of Classification Search
 USPC .............................. 381/120, 121, 123, 56–58, 104–107,381/71.1–71.5, 94.1–94.5; 330/297, 127
 See application file for complete search history.

(56) References Cited

U.S. PATENT DOCUMENTS

| 7,135,930 | B2 | 11/2006 | Verbist et al. | |
|---|---|---|---|---|
| 7,764,797 | B2* | 7/2010 | Yamamoto | H03F 3/20 381/120 |
| 8,553,908 | B2* | 10/2013 | Sugihara | H03F 1/0233 330/51 |
| 2006/0251270 | A1 | 11/2006 | Yang et al. | |
| 2010/0092009 | A1 | 4/2010 | Shimomura | |
| 2010/0202631 | A1* | 8/2010 | Short | H03G 7/002 381/104 |
| 2011/0170713 | A1 | 7/2011 | Sugihara et al. | |
| 2012/0134508 | A1* | 5/2012 | Inoue | 381/94.1 |

FOREIGN PATENT DOCUMENTS

| JP | 2000-165152 A | 6/2000 |
|---|---|---|
| JP | 2003-87684 A | 3/2003 |
| JP | 2005-130061 A | 5/2005 |
| JP | 2010-93624 A | 4/2010 |
| JP | 2011-166736 A | 8/2011 |

OTHER PUBLICATIONS

Japanese-language Written Opinion (PCT/ISA/237) dated Apr. 23, 2013 (three (3) pages).
European Search Report dated Jul. 8, 2015 (12 pages).

* cited by examiner

AUDIO AMPLIFIER AND POWER SUPPLY VOLTAGE SWITCHING METHOD

TECHNICAL FIELD

This invention relates to an audio amplifier and a power supply voltage switching method having an eco mode (power saving mode) where the power supply voltage of the power amplifier circuit is switched according to the volume or the like.

BACKGROUND ART

Various technologies of switching the power supply voltage supplied to an amplifier circuit have been proposed (for example, see Patent Document 1). In the power amplifier circuit of this Patent Document 1, a low voltage is normally supplied as the power supply voltage, the power supply voltage is switched to a high voltage when a large signal is input, and the occurrence of frequent switching is prevented by providing hysteresis for the switching between the high voltage and the low voltage and by making switching to the high voltage only when the number of times the signal input level exceeds a threshold value becomes equal to or greater than a predetermined number of times.

PRIOR ART DOCUMENT

Patent Document

Patent Document 1: JP-A-2000-165152

SUMMARY OF THE INVENTION

Problem that the Invention is to Solve

According to the technology of Patent Document 1, by preventing switching of the power supply voltage from occurring frequently, pop noise (popping sound) at the time of switching is prevented from occurring frequently. However, since the power supply voltage is immediately switched without consideration of the condition of the audio signal at that time when the power supply voltage switching condition is satisfied, the occurrence of pop noise cannot be suppressed after all.

An object of this invention is to provide an audio amplifier and a power supply voltage switching method that enable the power supply voltage of the amplifier circuit to be switched according to the volume or the like while the occurrence of pop noise is suppressed.

Means for Solving the Problem

This invention provides an audio amplifier provided with: an amplifier circuit that amplifies an input audio signal in a range of a power supply voltage; a power supply circuit that generates a plurality of power supply voltages; a power supply relay that selects one of the power supply voltages as a power supply voltage supplied to the amplifier circuit; a switching condition determiner that determines whether a switching condition which is a condition for switching the selection of the power supply voltage by the power supply relay is satisfied; a silent section detector that detects a silent section of the audio signal which is equal to or greater than an operation time of the power supply relay; and a switching instruction unit for providing the power supply relay with an instruction for switching the power supply voltage during the silent section when the switching condition is satisfied and the silent section is detected.

For example, the switching condition determiner determines whether the switching condition is satisfied based on at least one of an average signal level of the audio signal, a volume value which is a set value of a volume adjuster that adjusts a signal level of the audio signal and a number of times of clipping which is a number of times the audio signal exceeds a linear region of the amplifier circuit.

For example, the audio amplifier is further provided with: a background noise measurer that measures a background noise level in a listening space when a signal level of the audio signal is equal to or smaller than a predetermined level; and an average effective signal level calculator that calculates an average effective signal level which is a time-series average value of an effective signal level obtained by subtracting the background noise level from the signal level of the audio signal, and the switching condition determiner estimates the signal level of the audio signal input to the amplifier circuit based on the average effective signal level and the background noise level and determines whether the switching condition is satisfied based on the estimated signal level.

For example, the audio amplifier is further provided with a low voltage fixed mode setter that switches, when a parameter indicative of a size of a speaker connected to the amplifier circuit has contents indicative of a speaker smaller than a predetermined size, the selection of the power supply voltage by the power supply relay to a power supply voltage adequate for the speaker smaller than the predetermined size, and stops the operation of the switching condition determiner.

For example, the silent section detector has a buffer that delays the input audio signal, and detects the silent section of the audio signal by monitoring the audio signal stored in the buffer.

Moreover, the present invention provides a power supply voltage switching method provided with: amplifying an input audio signal by an amplifier circuit in a range of a power supply voltage; selecting, by a power supply relay, one of a plurality of power supply voltages generated by a power supply circuit as the power supply voltage supplied to the amplifier circuit; determining whether a switching condition which is a condition for switching the selection of the power supply voltage is satisfied; detecting a silent section of the audio signal which is equal to or greater than an operation time of the power supply relay; and switching the power supply voltage during the silent section when the switching condition is satisfied and the silent section is detected.

For example, whether the switching condition is satisfied is determined based on at least one of an average signal level of the audio signal, a volume value which is a set value of a volume adjuster that adjusts a signal level of the audio signal and a number of times of clipping which is a number of times the audio signal exceeds a linear region of the amplifier circuit.

For example, the power supply voltage switching method is further provided with: measuring a background noise level in a listening space when a signal level of the audio signal is equal to or smaller than a predetermined level; and calculating an average effective signal level which is a time-series average value of an effective signal level obtained by subtracting the background noise level from the signal level of the audio signal, the signal level of the audio signal input to the amplifier circuit is estimated based on the average effective signal level and the background noise level, and whether the switching condition is satisfied is determined based on the estimated signal level.

For example, when a parameter indicative of a size of a speaker connected to the amplifier circuit has contents indicative of a speaker smaller than a predetermined size, the selection of the power supply voltage by the power supply relay is switched to a power supply voltage adequate for the speaker smaller than the predetermined size, and the switching condition determination operation is stopped.

Advantage of the Invention

According to this invention, the power supply voltage supplied to the amplifier circuit can be switched from the high voltage to the low voltage according to the magnitude of the signal level (speaker volume) or the like, contribution can be made to power saving, and when audio is played back at a high volume, sound quality impairment can be avoided by increasing the power supply voltage. In this case, by performing the power source switching after a wait for a silent section, the occurrence of pop noise which is more annoying than audio waveform distortion can be prevented.

Moreover, since the silent section is detected by using a lip-sync function (audio signal-video signal synchronization function) that AV amplifiers are generally provided with, addition of new hardware is unnecessary, so that cost increase is avoided.

BRIEF DESCRIPTION OF THE DRAWINGS

FIG. 2 (a) is a flowchart showing speaker size detection processing, and (b) is a flowchart showing power supply voltage setting processing executed when the power of the audio amplifier is on.

MODE FOR CARRYING OUT THE INVENTION

Figure 1:
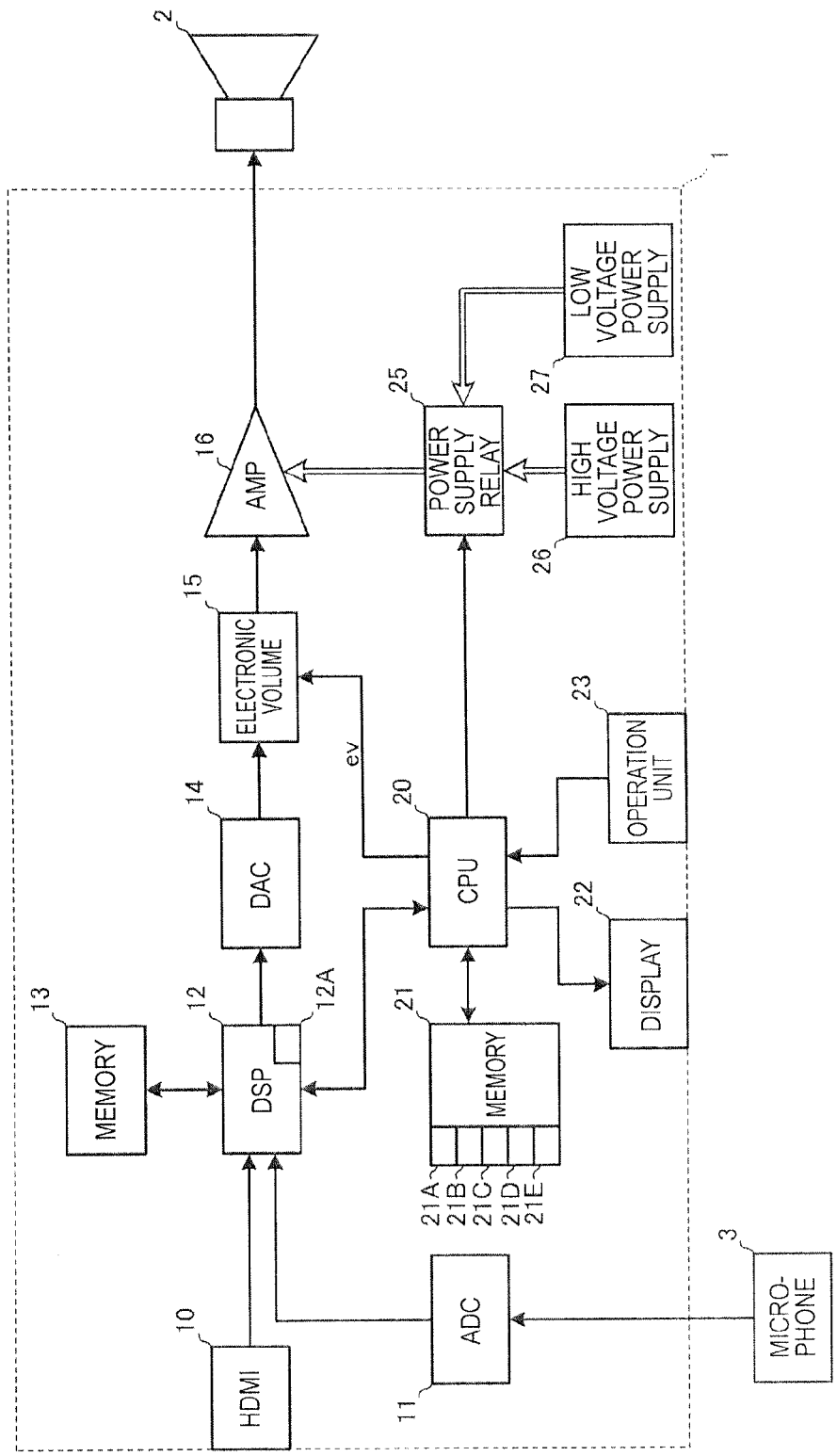
FIG. 1 A block diagram of an audio amplifier as an embodiment of this invention.

FIG. 1 is a block diagram of an audio amplifier as an embodiment of this invention. This audio amplifier is a so-called AV amplifier; an audio signal is extracted from a digital audio-video signal input from an HDMI terminal 10, this audio signal is processed by a DSP (digital sound processor) 12, and the audio signal processed by a D/A converter (DAC) 14 and an electronic volume 15 is amplified by a power amplifier circuit 16 and outputted to a speaker 2. The input audio-video signal is outputted to a television from a non-illustrated HDMI output terminal. While this figure shows only one speaker 2 (and one amplifier 16), the number of channels may be more than one such as 2 channels or 5.1 channels. The input terminal for the audio signal is not limited to the HDMI terminal 10. It may be a digital terminal of a different format, or may be an analog terminal. The audio signal input from an analog terminal is converted into a digital signal by an ND converter (ADC) 11 before input to the DSP 12.

As described above, the audio signal input from the HDMI terminal 10 is input to the DSP 12. The audio signal digitized by the ND converter 11 is also input to the DSP 12. A microphone 3 connected to the ND converter 11 is a microphone for measuring the frequency characteristic and size of the listening space and the speaker 2.

A memory 13 is connected to the DSP 12. The DSP 12 performs signal processing such as equalizing on the input audio signal, and buffers it in the memory 13 so that it is outputted with a delay of a predetermined time. This delay processing is a function called lip-sync for synchronizing the audio signal with the video signal the display of which takes time, and is a function that AV amplifiers are generally provided with. According to the lip-sync function, the audio signal can be delayed by approximately 250 ms. By observing the audio signal buffered in the memory 13, it can be found what the waveform is like that is outputted from the DSP 12 between that point of time and 250 ms later.

The DSP 12 is also provided with a peak hold unit 12A. The peak hold unit 12A stores the peak value of the signal outputted to the D/A converter 14. The peak hold value held by the peak hold unit 12A is read and reset by a CPU 20. The CPU 20 uses this peak hold value for the calculation of the audio signal level input to the power amplifier circuit 16.

The digital audio signal processed and delayed by the DSP 12 is input to the D/A converter (DAC) 14. The D/A converter 14 converts the digital audio signal into an analog audio signal, and inputs this audio signal converted into analog format to the electronic volume 15. The electronic volume 15 adjusts the voltage level of the audio signal by a volume value ev specified by the CPU 20. The CPU 20 increases or decreases the volume value ev according to an operation of an operation unit 23 or the background noise in the listening space. The audio signal having its voltage value adjusted by the electronic volume 15 is input to the power amplifier circuit (AMP) 16. The power amplifier circuit 16 amplifies the input audio signal, and outputs it to the speaker 2 connected to the outside.

As the power supply circuits that supply the power supply voltage to the power amplifier circuit 16, the following two are provided: a high voltage power supply circuit 26 that supplies a high voltage (50 V); and a low voltage power supply circuit 27 that supplies a low voltage (20 V). The high voltage power supply circuit 26 and the low voltage power supply circuit 27 are connected to a power supply relay 25. The power supply relay 25 is switched by a switching signal outputted from the CPU 20. When the power supply relay 25 is switched to the side of the high voltage power supply circuit 26, the high voltage of 50 V is supplied to the power amplifier circuit 16 (high voltage mode), and when the power supply relay 25 is switched to the side of the low voltage power supply circuit 27, the low voltage of 20 V is supplied to the power amplifier circuit 16 (low voltage mode or eco mode). The power supply relay 25 is a mechanical relay where the moving contact is moved by a magnet coil.

When the power supply voltage of 50 V is being supplied, the power amplifier circuit 16 can drive the speaker 2 at up to approximately 100 W, and when the power supply voltage of 20 V is being supplied, the power amplifier circuit 16 can drive the speaker 2 at up to approximately 30 W.

The operation of this audio amplifier 1 is controlled by the CPU 20. To the CPU 20, not only the above-described DSP 12, electronic volume 15 and power supply relay 25 are connected but also a memory 21, a display 22 and the operation unit 23 are connected.

In the memory 21, the following are set: a speaker size storage area 21A; a volume value storage area 21B; a low voltage fixed mode flag 21C; a voltage mode flag 21D; and a voltage switching flag 21E. In the speaker size storage area 21A, the size of the speaker 2 connected to this audio amplifier 1 is stored. In this embodiment, a parameter of either Large or Small is stored. While this speaker size parameter may be input by the user operating the operation unit 23, in this embodiment, a test sound is emitted from the speaker 2, and this sound is picked up by the microphone 3 and analyzed to thereby estimate the size of the speaker 2. When the speaker size is set by manual input, the parameter is determined based on the diameter, the rated maximum input, the cut-off frequency or the like.

In the volume value storage area 21B, the volume value ev which is the set value of the electronic volume 15 is stored. The volume value ev is set by the user operating the operation unit, and the CPU 20 changes the setting based on the signal level of the audio signal and the background noise level.

The low voltage fixed mode flag 21C is a flag storing a low voltage fixed mode. The low voltage fixed mode is a mode in which when the speaker size is the small size, since driving the speaker 2 at high power not only merely results in emission of a distorted sound but also can damage the speaker 2, the speaker 2 is driven with the power supply voltage of the power amplifier circuit 16 fixed to the low voltage.

The voltage mode flag 21D is a flag storing the current voltage mode, that is, which of the high voltage and the low voltage is selected as the power supply voltage supplied to the power amplifier circuit 16. The status of the flag is Hi (=1) or Lo (=0).

The voltage switching flag 21E is a flag that is set when the CPU 20 determines to switch the power supply voltage according to the signal level of the audio signal or the like during the normal operation of the audio amplifier 1. This flag is a three-status flag; when it is determined to switch from the low voltage to the high voltage, 1 is set, and when it is determined to switch from the high voltage to the low voltage, 2 is set. When the audio amplifier 1 is excellently operating at the current power supply voltage and switching is unnecessary, 0 is set.

In addition thereto, in the memory 21, a storage area storing various variables described in explanations of flowcharts given below is set.

The operation unit 23 has various operation members such as a power switch, a volume dial and a source change-over switch. The display 22 has a matrix display that displays the volume value and the source name being played back.

Figure 5:
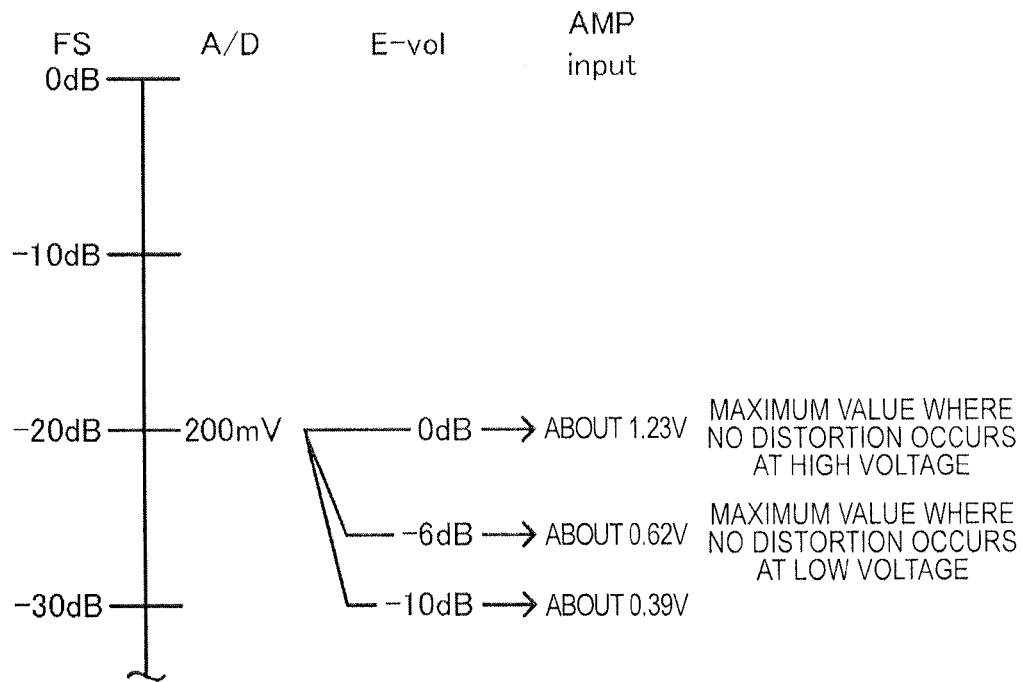
FIG. 5 A view explaining the relationship between the decibel value of a digital audio signal and the decibel value of an analog audio signal.

Now, referring to FIG. 5, the relationship between the decibel values of the digital audio signal processed by the DSP 12 and the analog audio signal amplified by the power amplifier circuit 16 will be described. In the case of the digital audio signal, the maximum value is 0 dB (0 dBFS), and is completely hard-clipped at this 0 dBFS. On the other hand, in the case of the analog audio signal, 0 dB which is the upper limit of the linear region where it can be amplified without any distortion is associated with −20 dBFS of the digital audio signal, and when an audio signal exceeding 0 dB is input to the power amplifier circuit 16, the outputted signal waveform is distorted (analog clip). This distortion becomes larger as the dB value becomes higher, and the waveform becomes completely saturated in the vicinity of +20 dB. As described above, at the analog audio circuit, signals exceeding 0 dB can also be processed (amplified) although the waveform is distorted.

When the high voltage of 50 V is being supplied, the power amplifier circuit 16 can amplify audio signals of up to 0 dB, and when the low voltage of 20 V is being supplied, the power amplifier circuit 16 can amplify audio signals of up to −6 dB without any distortion.

When the DSP 12 outputs a digital audio signal of −20 dBFS, the D/A converter 14 converts this signal into an analog audio signal of 0 dB (approximately 1.23 V). When the set value ev of the electronic volume 15 is 0 dB, this signal is input to the power amplifier circuit 16 as it is (in a state of being held at approximately 1.23 V).

The CPU 20 determines whether the power amplifier circuit 16 can operate at the low voltage (20 V) or not by monitoring the signal level of the audio signal input to the power amplifier circuit 16, the background noise level and the like, and determines to switch the power supply voltage (power supply relay 25) based on the result of the determination. In order to perform this power supply voltage switching in such a manner that no pop noise (popping sound) occurs, the power supply voltage switching is deferred until a silent period comes that is longer than the switching time (approximately 50 ms) of the power supply relay 25 which is a mechanical relay, and is performed when the silent period comes.

As described above, even if the level of the input signal is too high, it merely causes slight waveform distortion which does not cause significant discomfort to listening, and pop noise caused at the time of power supply voltage switching is more annoying than that; for this reason, the power amplifier circuit 16 does not immediately make switching when it is determined to switch the power supply voltage, and waits for the time when the power supply voltage can be switched without any pop noise.

Referring to the flowcharts of FIG. 2 to FIG. 4, the above-mentioned power supply voltage switching operation will be described.

Figure 2:
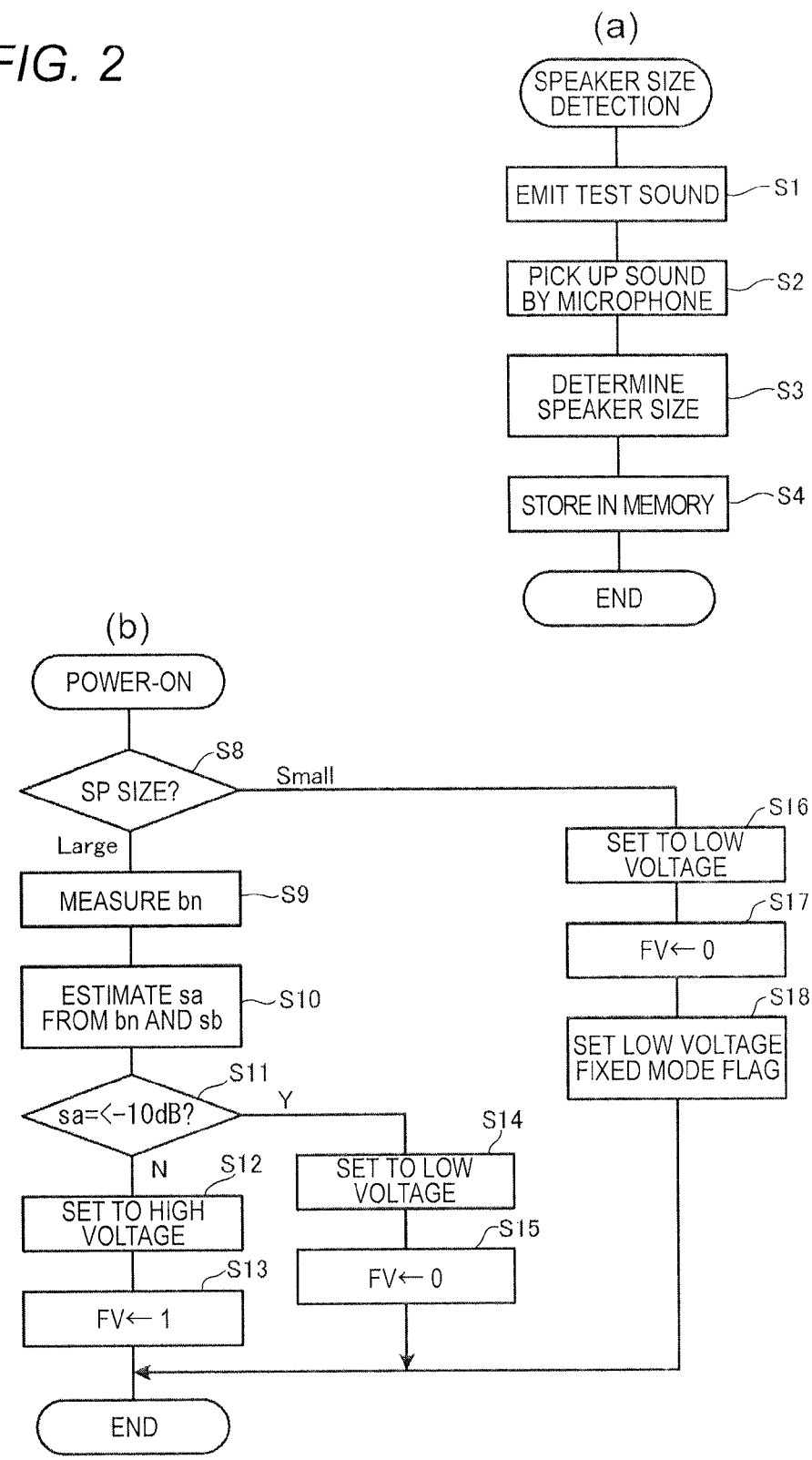

FIG. 2(*a*) is a flowchart showing speaker size detection processing. This speaker size detection processing is an operation executed when a speaker is connected to the audio amplifier 1, that is, at the time of setting of the audio amplifier 1. The CPU 20 instructs the DSP 12 to emit a test sound (S1). Examples of the test sound include white noise and a sweep sound. This test sound is supplied to the speaker 2 through the DAC 14, the electronic volume 15 and the power amplifier circuit 16, and emitted into the listening space. The set value of the electronic volume 15 is set to 0 dB. Simultaneously, the sound emitted from the speaker 2 is picked up by the microphone 3, converted into a digital signal by the ND converter 11, and captured into the DSP 12 (S2). The test sound emission at S1 and the sound pickup at S2 are performed simultaneously. After the test sound emission by the speaker 2 and the sound pickup by the microphone 3, the sound captured in the DSP 12 is analyzed and the size of the speaker 2 (speaker size) is determined (S3). The speaker size can be determined based on the cutoff of the emitted sound, the distortion of the waveform and the like. In this embodiment, the speaker size is determined as either of two kinds of large size (L) or small size (S). The determined speaker size is stored in the speaker size storage area 21A of the memory 21.

FIG. 2(*b*) is a flowchart showing power supply voltage setting processing executed when the power switch of the audio amplifier 1 is turned on at the time of normal operation. When the power switch is turned on, the CPU 20 reads the speaker size detected by the speaker size detection processing of FIG. 2(a) in advance, from the speaker size storage area 21A, and determines whether the speaker is the large size or the small size (S8). When the speaker size is the small size (Small at S8), the low voltage (20 V) is selected as the power supply voltage, and a signal is transmitted to the power supply relay 25 so as to switch to the side of the low voltage power supply circuit 27 (S16). Then, 0 is set to a voltage mode flag FV (S17), and the low voltage fixed mode flag 21C is set (S18).

Figure 3:
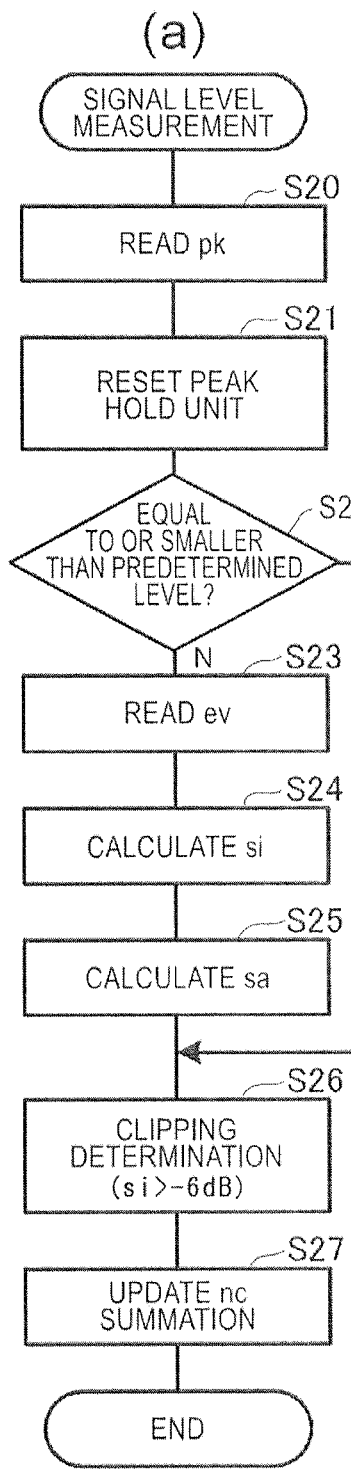
FIG. 3 (a) is a flowchart showing signal level measurement processing, and (b) is a flowchart showing background noise measurement processing.
Figure 3:
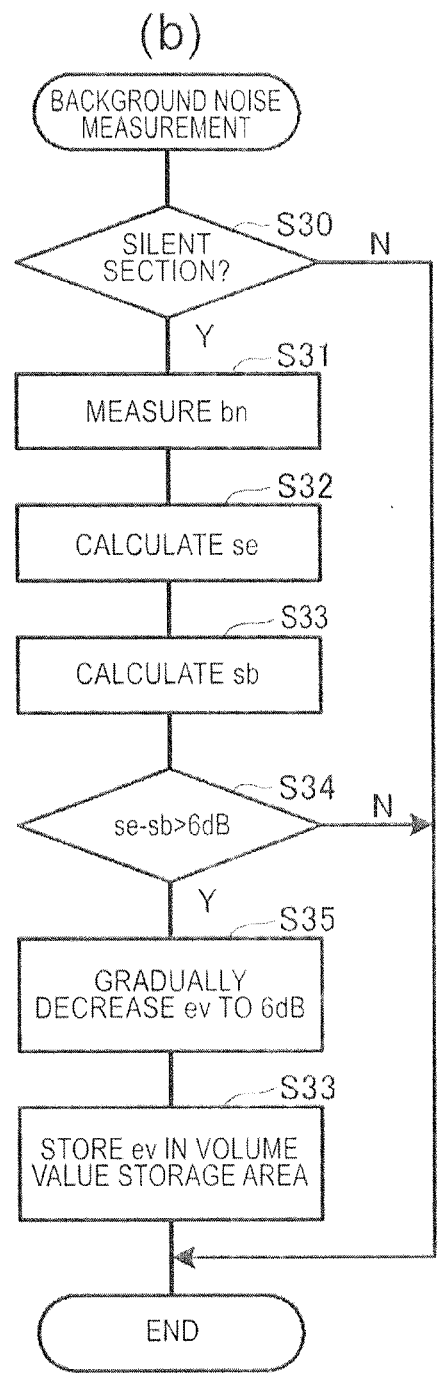
Figure 4:
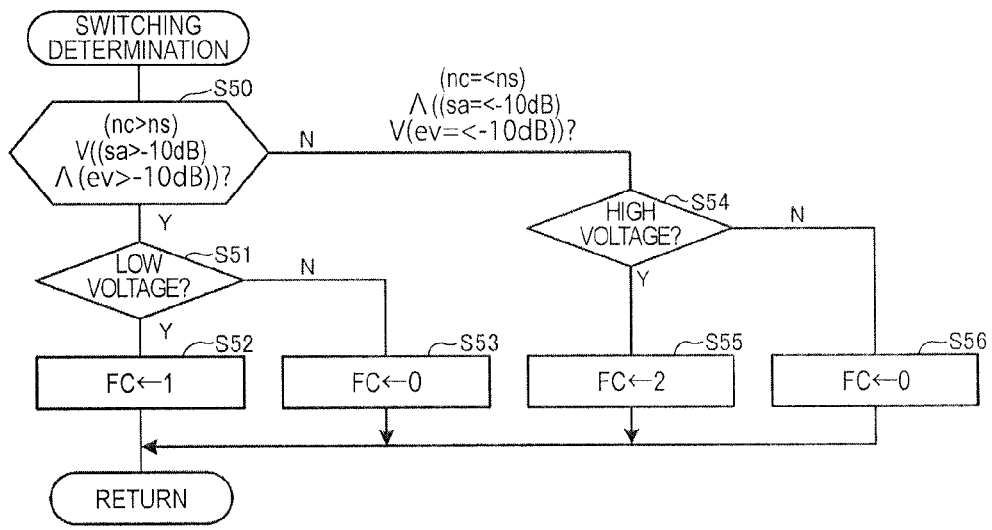
FIG. 4 (a) is a flowchart showing switching condition determination processing, and (b) is a flowchart showing voltage switching processing.
Figure 4:
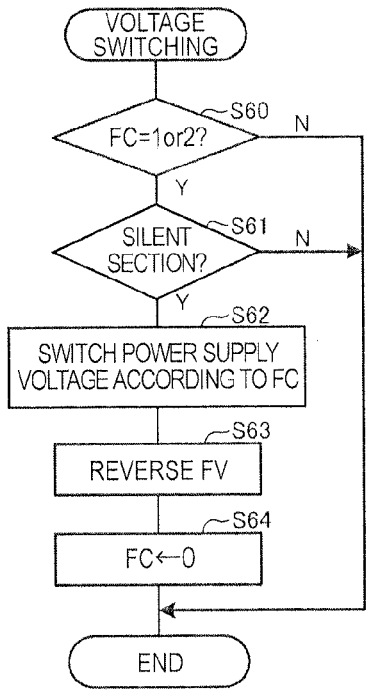

When the low voltage fixed mode flag 21C is set at S18 to set the low voltage fixed mode, the power supply control operation described with reference to FIG. 3 and FIG. 4 is not performed, and the power supply voltage is held at the low voltage. When the low voltage fixed mode is set, the volume value ev may be limited so as not to become higher than a predetermined value (for example, −6 dB) even if there is a user operation.

While when the speaker size is determined as the large size at S8 (Large at S8), the background noise level in the listening space is measured by using the microphone 3 to determine the voltage of the power amplifier circuit 16 and the power supply voltage is set to the high voltage or the low voltage based on this determination, description of this processing will be given after background noise measurement processing of FIG. 3(b) is described.

The flowcharts of FIG. 3 and FIG. 4 are flowcharts showing power supply voltage control operations executed while the power is on. These operations are repetitively executed at predetermined intervals (for example, 10 ms). While the background noise measurement processing and voltage switching processing of FIG. 3(b) and FIG. 4(b) sometimes take a time equal to or greater than 10 ms, the condition is checked every 10 ms, and when the operation is being performed, the condition is maintained as it is, and when the operation is not being performed, activation is performed.

FIG. 3(a) is a flowchart showing signal level measurement processing. The CPU 20 reads the peak hold value pk from the peak hold unit 12A of the DSP 12 (S20), and resets the peak hold unit 12A thereafter (S21) so that the peak value up to the next reading timing is held. It is determined whether the read peak hold value pk is equal to or smaller than a predetermined level that can be considered silence (S22). The predetermined level is set, for example, to approximately −60 dB. When the peak hold value pk is equal to or smaller than the predetermined level (YES at S22), the process proceeds to clipping determination (S26) without performing signal level calculation.

When it is determined that the peak hold value pk is higher than the predetermined level (NO at S2), the volume value ev is read from the volume value storage area 21B (S23), and the signal level si which is the level of the sound signal input to the power amplifier circuit 16 is calculated based on the peak hold value pk and the volume value ev, that is, by adding the peak hold value pk (dB value) and the volume value ev (dB value) (S24). Then, (one hundred) signal levels si calculated this time and in the past one second are averaged to calculate the average signal level sa (S25). This average signal level sa corresponds to the volume level of the sound currently emitted from the speaker 2 (speaker volume). Further, it is determined whether or not the current signal level si is higher than −6 dB which is the level where a distortion (clipping) occurs in the output signal (clipping level) when the power supply voltage is the low voltage (S26). Then, the summation of the number nc of times of clipping which is the number of times the clipping level is exceeded in the immediately preceding predetermined time (for example, five seconds) is updated (S27). Based on this number of times of clipping, in switching determination processing of FIG. 4(a), it is determined whether to switch the power supply voltage of the power amplifier circuit 16 from the low voltage to the high voltage or not.

FIG. 3(b) is a flowchart showing the background noise measurement processing. In this processing, first, whether a silent section (of approximately 100 ms) where no sound is emitted from the speaker 2 occurs is determined (S30). As described above, the DSP 12 buffers the input audio signal in order to delay it by 250 ms. By observing the contents of this buffer, it can be found whether a silent section of approximately 100 ms occurs from now or not. For the silence, it is not necessary that the digital audio output be completely 0 but it is necessary only that it be a sufficiently small sound (for example, equal to or smaller than approximately −60 dB).

When it is determined that it is a silent section (YES at S30), the sound (background noise) in the listening space picked up by the microphone 3 is captured through the ND converter 11, and the background noise level bn is measured (S31). Then, this background noise level bn (dB value) is subtracted from the latest average signal level sa (dB value) calculated by the signal level measurement processing of FIG. 3(a), thereby calculating an effective signal level se (s32). This effective signal level se corresponds to the volume level of the sound that is not buried in the background noise but is actually audible to the user.

Figure 6:
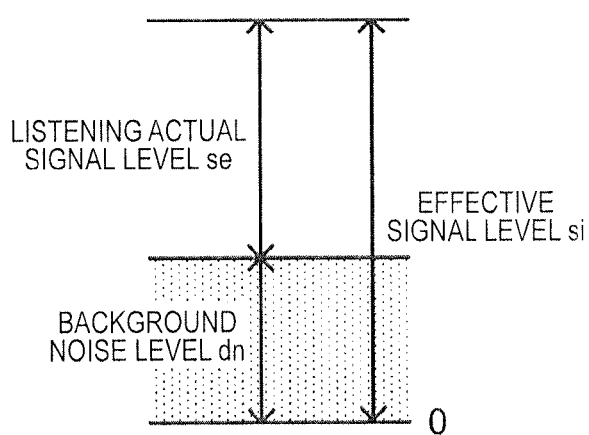
FIG. 6 A view explaining the relationship among a signal level, a background noise level and an effective signal level.

That is, as shown in FIG. 6, of the average signal levels sa, the level corresponding to the background noise level bn is masked by the background noise and inaudible to the user, and of the average signal levels sa, the effective signal level se higher than the background noise level bn is the volume level of the played-back sound that is actually audible to the user.

Then, this effective signal level se is further moving-weighted-averaged to calculate the average effective signal level sb (S34). This average effective signal level sb corresponds to the substantial volume level that the user normally listens to. When the effective signal level se which is the current value is more than 6 dB higher than the average effective signal level sb which is the normal value, it is determined that the volume is too high, and the volume value ev is gradually decreased by 6 dB (S35). The value decreased by 6 dB is stored in the volume value storage area 21B (S33). The processing of S35 to S37 prevents the occurrence of a case where a sound is played back at an unnecessarily high volume when surroundings become silent.

The processing of S35 to S37 may be designed so that it can be inhibited by a user setting. When the effective signal level se is more than 6 dB lower than the average effective signal level sb, the volume value ev may be increased.

While the measurement of the background noise level bn is performed when a silent section of approximately 100 ms occurs as described above, the above-mentioned moving average may be averaged by time factor weighting or may be averaged by weighing according to the measurement opportunity. In any case, setting is made so that the weight of the current measurement result is the heaviest and the older the measurement values are, the lighter the weights thereof are.

Now, the processing executed when the speaker size is the large size (Large at S8) in the processing executed when the power is on in FIG. 2(b) will be described. First, the background noise level bn is measured (S9). Based on the measured background noise level bn and the normal average effective signal level sb accumulated in the last operations, the average signal level sa which is the sound emission volume level set by the user is estimated (S10). That is, deeming that the user sets a sound emission volume level such that the volume actually audible beyond the background noise level bn is the average effective signal level sb, bn+sb is set as the estimated value of sa. When this estimated value sa is equal to or smaller than −10 dB (YES at S11), the power supply voltage is set to the low voltage, that is, the power supply relay 25 is switched to the side of the low voltage power supply circuit 27 (S14), and the voltage mode flag FV is set to 0 (low voltage) (S15). On the other hand, when the estimated value sa is higher than −10 dB (NO at S11), the power supply voltage is set to the high voltage, that is, the power supply relay 25 is switched to the side of the high voltage power supply circuit 26 (S12), and the voltage mode flag FV is set to 1 (high voltage) (S13).

Returning to the description of the operation executed during the power is on, FIG. 4(*a*) is a flowchart showing switching condition determination processing. This processing is processing of determining whether to switch the power supply voltage (power supply circuit) or not based on the number nc of times of clipping and the average signal level sa obtained by the signal level measurement processing of FIG. 3(*a*) and the volume value ev stored in the volume value storage area 21B. In this processing, when a condition that "the number nc of times of clipping is higher than a threshold number ns of times (50 times) or the average signal level sa is higher than −10 dB and the volume value ev is also higher than −10 dB" (high voltage switching condition) is satisfied, it is determined to switch to the high voltage. Whether the signal level si is higher than the clipping level or not is determined every 10 ms in the signal level measurement processing of FIG. 3(*a*), and the number nc of times of clipping is the number of times the signal level si exceeds the clipping level in the last five seconds. Therefore, that the threshold number ns of times=50 means that the signal level si is higher than the clipping level (signal is distorted) in 1/10 of the 500 measurement opportunities in five seconds. Conversely, when a condition is satisfied that "the number nc of times of clipping is equal to or smaller than the threshold number ns of times and the average signal level sa or the volume value ev is equal to or smaller than −10 dB" (low voltage switching condition), it is determined to switch to the low voltage.

In the flowchart of FIG. 4(*a*), it is determined at S50 which of the high voltage switching condition and the low voltage switching condition is satisfied by the number nc of times of clipping, the average signal level sa and the volume value ev. When the high voltage switching condition is satisfied (YES at S50), whether the current voltage is the low voltage or not is determined (S51). When it is the low voltage (FV=0) (YES at S51), 1 is set to a voltage switching flag FC (S52). When it is not the low voltage (when it is the high voltage [FV=1]) (NO at S51), 0 is set to the voltage switching flag FC (S53).

When the high voltage switching condition is not satisfied at S50, that is, when the low voltage switching condition is satisfied (NO at S50), whether the current voltage is the high voltage or not is determined (S54). When it is the high voltage (FV=1) (YES at S54), 2 is set to the voltage switching flag FC (S55). When it is not the high voltage (when it is the low voltage [FV=0]) (NO at S54), 0 is set to the voltage switching flag FC (S56).

The high voltage and low voltage switching conditions are not limited to the above-mentioned ones. Determination may be made by using some of the number nc of times of clipping, the average signal level sa and the volume level ev or determination may be made by using parameters other than these.

FIG. 4(*b*) is a flowchart showing the voltage switching processing. Switching of the power source is performed after a wait for a silent section of approximately 100 ms so that no pop noise of a popping sound is caused by the switching of the power supply relay 25 which is a mechanical relay, after 1 or 2 is set to the voltage switching flag FC in the switching condition determination processing of FIG. 4(*a*). For this reason, in this processing, first, whether 1 or 2 is set to the voltage switching flag FC is determined (S60), and when 1 or 2 is set to the voltage switching flag FC (YES at S60), whether a silent section of approximately 100 ms continues from now is determined (S61). This determination of the silent section is similar to that in the case of the background noise measurement processing of FIG. 3(*b*).

When it is determined that a silent section of 100 ms continues from the current point of time (YES at S61), the power supply voltage (power supply relay 25) is switched according to the value set to the voltage switching set (S62). When switching from the low voltage to the high voltage is made, the voltage mode flag FV is reversed from 0 to 1, and when switching from the high voltage to the low voltage is made, the voltage mode flag FV is reversed from 1 to 0 (S63). Then, the voltage switching flag FC is reset (0 is set) (S64).

In the operation of FIG. 4(*b*), switching is not performed when the voltage switching flag is reset (=0) before a silent section which is the power supply voltage switching timing is detected.

In the low voltage mode, the DSP 12 may be caused to perform dynamic range compression (DRC) processing so that the audio signal is not readily clipped. Moreover, the DRC processing may be set so as to be performed only when 1 is set to the voltage switching flag 21E, that is, when the switching timing has not come yet although it is determined to switch from the low voltage to the high voltage.

While a mode in which one speaker 2 is connected to one power amplifier circuit 16 is described in the embodiment shown above, the number of power amplifier circuits 16 is not limited to one. More than one power amplifier circuit 16 may be provided such as 2 channels or 5.1 channels. When the power supply relay 25 is separately provided for each power amplifier circuit 16 in a case where more than one power amplifier circuit 16 is provided, the determination of the speaker size, or the low voltage fixed mode of FIG. 2(*b*) is separately executed for each power amplifier circuit 16 (connected speaker 2).

When one common power supply relay 25 is provided for more than one power amplifier circuit 16, the adaptation may be made to the smallest one of the speaker sizes detected in the speaker size detection processing of FIG. 2(*a*). That is, when at least one small-size speaker is detected, the low voltage fixed mode may be set. Moreover, the adaptation may be made to the speaker size of the main speaker (for example, the front channel).

Moreover, the power amplifier circuit 16 may be a class A amplifier circuit, or may be a class AB or class B amplifier circuit. The power supply circuit may be a unipolar power source or a bipolar power source.

While the power supply voltage is two levels of the high voltage (50 V) and the low voltage (20 V) in this embodiment, the number of levels of the power supply voltage and the voltages are not limited thereto. When the number of levels is three or more, parameters such as the number nc of times of clipping, the average signal level sa and the volume value ev are determined with the number of divisions conforming to the number of levels.

The present application is based on Japanese Patent Application (Patent Application No. 2012-037732) filed on Feb. 23, 2012, the contents of which are incorporated herein by reference.

INDUSTRIAL APPLICABILITY

According to the present invention, an audio amplifier can be provided in which the power supply voltage supplied to the amplifier circuit can be switched from the high voltage to the low voltage according to the magnitude of the signal level (speaker volume), contribution can be made to power saving, and when audio is played back at a high volume, sound quality impairment can be avoided by increasing the power supply voltage.

DESCRIPTION OF REFERENCE NUMERALS AND SIGNS

1 Audio amplifier
2 Speaker
3 Microphone
12 DSP
12A Peak hold unit
21 Memory
21A Speaker size storage area
21B Volume value storage area
21C Low voltage fixed mode flag
21D Voltage mode flag
21E Voltage switching flag

The invention claimed is:

1. An audio amplifier comprising:
an amplifier configured to amplify an input audio signal in a range of a power supply voltage;
a power supply configured to generate a plurality of power supply voltages;
a relay configured to select one of the power supply voltages as a power supply voltage to be supplied to the amplifier;
a determiner configured to determine whether a condition for switching from one selected power supply voltage to another power supply voltage to be selected by the relay is satisfied;
a detector configured to detect a period of no audio signal in the input audio signal which is equal to or greater than a required time to switch the relay; and
a controller configured to switch from the one selected power supply voltage to the another power supply voltage by the relay if said condition is satisfied and said period of no audio signal is detected, wherein
the another power supply voltage has a magnitude other than 0V.

2. The audio amplifier according to claim 1, wherein the determiner determines whether the condition is satisfied based on at least one of an average signal level of the input audio signal, a volume value, and a number of times of clipping.

3. The audio amplifier according to claim 1, further comprising:
a measurer configured to measure a background noise level in a listening space when a signal level of the input audio signal is equal to or smaller than a predetermined level; and
a calculator configured to calculate an average effective signal level which is a time-series average value of an effective signal level obtained by subtracting the background noise level from the signal level of the input audio signal, wherein
the determiner estimates the signal level of the input audio signal input to the amplifier based on the average effective signal level and the background noise level, and determines whether the condition is satisfied based on the estimated signal level.

4. The audio amplifier according to claim 1, wherein the controller is further configured to switch, when a parameter of a size of a speaker connected to the amplifier is smaller than a predetermined size, the relay to a power supply voltage adequate for the smaller speaker, and stops the function of the determiner.

5. The audio amplifier according to claim 1, wherein the detector has a buffer that delays the input audio signal, and detects the period of no audio signal by monitoring the input audio signal stored in the buffer.

6. A power supply voltage switching method comprising:
amplifying an input audio signal by an amplifier in a range of a power supply voltage;
selecting, by a relay, one of a plurality of power supply voltages generated by a power supply as the power supply voltage to be supplied to the amplifier;
determining whether a condition for switching from one selected power supply voltage to another power supply voltage to be selected by the relay is satisfied;
detecting a period of no audio signal in the input audio signal which is equal to or greater than a required time to switch the relay; and
switching from the one selected power supply voltage to the another power supply voltage by the relay if said condition is satisfied and said period of no audio signal is detected, wherein
the another power supply voltage has a magnitude other than 0V.

7. The power supply voltage switching method according to claim 6, wherein whether the condition is satisfied is determined based on at least one of an average signal level of the input audio signal, a volume value, and a number of times of clipping.

8. The power supply voltage switching method according to claim 6, further comprising:
measuring a background noise level in a listening space when a signal level of the input audio signal is equal to or smaller than a predetermined level; and
calculating an average effective signal level which is a time-series average value of an effective signal level obtained by subtracting the background noise level from the signal level of the input audio signal, wherein
the signal level of the input audio signal input to the amplifier is estimated based on the average effective signal level and the background noise level, and whether the condition is satisfied is determined based on the estimated signal level.

9. The power supply voltage switching method according to claim 6, wherein when a parameter of a size of a speaker connected to the amplifier is smaller than a predetermined size, the relay is switched to a power supply voltage adequate for the smaller speaker, and the determination function is stopped.

* * * * *